(12) United States Patent
Lu et al.

(10) Patent No.: US 11,397,895 B2
(45) Date of Patent: Jul. 26, 2022

(54) NEURAL NETWORK INFERENCE WITHIN PHYSICAL DOMAIN VIA INVERSE DESIGN TOOL

(71) Applicant: X Development LLC, Mountain View, CA (US)

(72) Inventors: Jesse Lu, Hollister, CA (US); Brian Adolf, San Mateo, CA (US); Martin Schubert, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 695 days.

(21) Appl. No.: 16/393,666

(22) Filed: Apr. 24, 2019

(65) Prior Publication Data

US 2020/0342325 A1 Oct. 29, 2020

(51) Int. Cl.
*G06N 3/08* (2006.01)
*G06F 30/00* (2020.01)

(52) U.S. Cl.
CPC ............. *G06N 3/084* (2013.01); *G06F 30/00* (2020.01)

(58) Field of Classification Search
CPC ...... G06N 3/084; G06N 3/0454; G06F 30/00; G06F 30/23; G06F 30/27; G02B 5/0236; G02B 5/0268
USPC .......................................................... 703/1
See application file for complete search history.

(56) References Cited

U.S. PATENT DOCUMENTS

| | | | |
|---|---|---|---|
| 5,774,693 A | 6/1998 | Hsu et al. | |
| 6,772,076 B2 | 8/2004 | Yamamoto et al. | |
| 7,392,230 B2 | 6/2008 | Nugent | |
| 7,398,259 B2 | 7/2008 | Nugent | |
| 9,589,757 B1 | 3/2017 | Hannon et al. | |

(Continued)

FOREIGN PATENT DOCUMENTS

| WO | 2014/203038 A1 | 12/2014 |
|---|---|---|
| WO | 2017/176370 A1 | 10/2017 |

(Continued)

OTHER PUBLICATIONS

Hughes et al., "Training of photonic neural networks through in situ backpropagation", ARXIV. org, Cornell University Library May 25, 2018.

(Continued)

*Primary Examiner* — Cedric Johnson
(74) *Attorney, Agent, or Firm* — Christensen O'Connor Johnson Kindness PLLC

(57) ABSTRACT

A computer-implemented method for revising structural parameters of a physical device is provided. The method comprises configuring a simulated environment to be representative of the physical device based on an initial description that describes structural parameters of the physical device. The method further includes performing an operational simulation of the physical device based on training data representative of physical stimuli within a physical domain to simulate an interaction between the physical device and the physical stimuli. The method further includes computing a loss value based on a simulated output of the physical device and performing and adjoint simulation by backpropagating the loss value through the simulated environment. The method also includes generating a revised description of the physical device by updating the structural parameters to reduce the loss value.

27 Claims, 9 Drawing Sheets

(56) References Cited

U.S. PATENT DOCUMENTS

| | | | |
|---|---|---|---|
| 10,970,441 B1* | 4/2021 | Zhang | G06N 3/084 |
| 2004/0225483 A1 | 11/2004 | Okoniewski et al. | |
| 2010/0312539 A1 | 12/2010 | Yamagajo et al. | |
| 2012/0150780 A1 | 6/2012 | Nugent | |
| 2014/0365188 A1 | 12/2014 | Doerr | |
| 2016/0012176 A1 | 1/2016 | Liu et al. | |
| 2016/0033765 A1 | 2/2016 | Liu et al. | |
| 2016/0174902 A1 | 6/2016 | Georgescu et al. | |
| 2018/0018757 A1 | 1/2018 | Suzuki | |
| 2018/0045953 A1 | 2/2018 | Fan et al. | |
| 2018/0053090 A1 | 2/2018 | Voelker et al. | |
| 2018/0189645 A1 | 7/2018 | Chen et al. | |
| 2018/0284834 A1 | 10/2018 | Abel et al. | |
| 2020/0265328 A1* | 8/2020 | Kaditz | G06N 3/0454 |

FOREIGN PATENT DOCUMENTS

| | | | |
|---|---|---|---|
| WO | 2017/223560 A1 | 12/2017 | |
| WO | WO-2019162204 A1 * | 8/2019 | G03F 7/705 |

OTHER PUBLICATIONS

Shen et al., "Deep learning with coherent nanophotonic circuits", Nature Photonics, vol. 11, No. 7, Jun. 12, 2017.

Partial International Search Report, dated Aug. 3, 2020, in corresponding International Patent Application No. PCT/US2020/027269, 18 pages.

International Search Report and Written Opinion, dated Sep. 28, 2020, in corresponding International Patent Application No. PCT/US2020/027269, 22 pages.

Chen, R.T. et al., "Neural Ordinary Differential Equations", 32nd Conference on Neural Information Processing Systems (NIPS 2018), Oct. 22, 2018, 18 pages.

Petykiewicz, J. et al., "Active Nanophotonics: Inverse Design and Strained Germanium Light Emitters", A Dissertation Submitted to the Department of Electrical Engineering and the Committee on Graduate Studies of Stanford University, Oct. 2016. 134 pages.

Ying-Shou Lu, J., "Nanophotonic Computational Design", A Dissertation Submitted to the Department of Electrical Engineering and the Committee on Graduate Studies of Stanford University, Jun. 2013, 122 pages.

Piggott, A.Y., "Automated Design of Photonic Devices", A Dissertation Submitted to the Department of Electrical Engineering and the Committee on Graduate Studies of Stanford University, Jun. 2018, 112 pages.

Lu, J. et al., "Nanophotonic Computational Design", Optics Express, vol. 21, No. 11, Jun. 3, 2013, 17 pages.

Piggott, A. Y. et al., "Inverse Design and Implementation of a Wavelength Demultiplexing Grating Coupler", Scientific Reports, Nov. 27, 2014, 5 pages.

Piggott, A.Y. et al., "Inverse Design and Demonstration of a Compact and Broadband On-Chip Wavelength Demultiplexer", Nature Photonics, May 11, 2015, 5 pages.

Piggott, A.Y. et al., "Silicon Photonics: Design Approach to Integrated Photonics Explores Entire Space of Fabricable Devices", Laser Focus World, Aug. 13, 2018, 5 pages.

Piggott, A. Y. et al., "Fabrication-constrained Nanophotonic Inverse Design", Scientific Reports, May 11, 2017, 7 pages.

Su, L. et al., "Inverse Design and Demonstration of a Concept On-Chip Narrowband Three-Channel Wavelength Demultiplexer", ACS Photonics, Aug. 17, 2017, 6 pages.

Su, L. et al., Fully-Automated Optimization of Grating Couplers, Optics Express, vol. 26, No. 4m Feb. 2018, 12 pages.

Robinson, J.T., "First-Principle Derivation of Gain in High-Index-Contrast Waveguides", Optics Express, vol. 16, No. 21, Oct. 13, 2008, 11 pages.

Lalau-Keraly, C.M. et al., "Adjoint Shape Optimization Applied to Electromagnetic Design", Optical Society of America, 2013, 9 pages.

Shen, Y. et al., "Deep Learning with Coherent Nanophotonic Circuits", Nature Photonics, vol. 11,, Oct. 7, 2016, 8 pages.

Lin, X. et al., "All-Optical Machine Learning Using Diffractive Deep Neural Networks", Science vol. 361, Issue 6406, Sep. 7, 2018, 20 pages.

Tanaka, G. et al., "Recent Advances in Physical Reservoir Computing: A Review", arXiv:1808.04962v1, Aug. 15, 2018, 54 pages.

Introduction to SAW Filter Theory & Design Techniques, API Technologies, Mar. 15, 2018, 28 pages.

\* cited by examiner

NEURAL NETWORK INFERENCE WITHIN PHYSICAL DOMAIN VIA INVERSE DESIGN TOOL

TECHNICAL FIELD

This disclosure relates generally to design tools, and in particular but not exclusively, relates to design tools for electromagnetic, acoustic, and fluidic devices.

BACKGROUND INFORMATION

Electromagnetic devices (e.g., optical devices, electrical devices, or otherwise) are devices that generate, manipulate, propagate, and/or measure electromagnetic radiation. Their applications vary broadly and include, but are not limited to, acousto-optic modulators, optical modulators, optical ring resonators, distributed Bragg reflectors, lasers, lenses, transistors, waveguides, antennas, and the like. Conventional techniques for the design of these devices are sometimes determined through a simple guess and check method in which a small number of design parameters of a pre-determined design are adjusted for suitability to a particular application. However, in actuality, these devices may have design parameters ranging from hundreds all the way to many billions, dependent on the device size and functionality.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1:
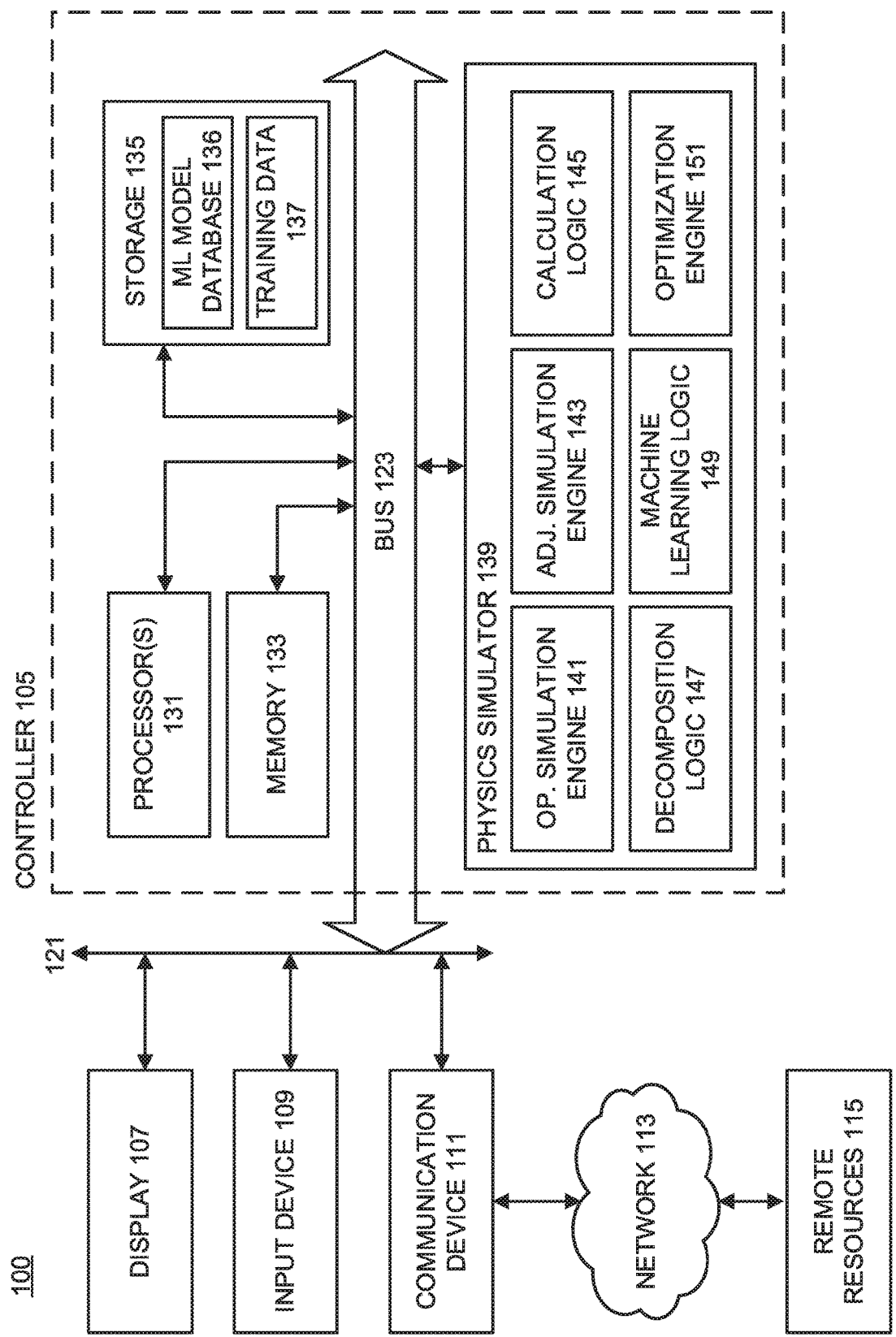
FIG. 1 is a functional block diagram illustrating a system for revising structural parameters of a physical device, in accordance with an embodiment of the present disclosure.

Embodiments of an apparatus, system, and method for physical device optimization as well as embodiments of resultant physical devices are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

A deep neural network is a type of machine learning algorithm modeled loosely after the human brain. More specifically, a deep neural network provides an output in response to receiving an input; the output being dependent on the task the neural network was trained to perform. For example, a trained deep neural network may receive an image (e.g., of a cat), perform inference calculations, and subsequently output a value (e.g., probabilistic certainty) classifying the contents of the image (e.g., a confidence level that the image contains a cat). More generally, advances in neural networks have helped computer systems progress in performing complex tasks such as object recognition, machine translation, autonomous driving, among many others. However, as desired accuracy and functionality of neural networks increases, complexity of architecture has followed suit. Thus, as machine learning models become increasingly sophisticated, the compute (and power) associated with inference calculations on neural networks have become significant. Further still, bottlenecks in both compute and energy may inhibit the proliferation of machine learning models to low-powered, distributed devices (e.g., cellphones, internet of things devices, and the like).

However, rather than limiting the computations of neural networks to the digital domain (e.g., calculations performed by traditional processors), described herein are embodiments of a physics simulator that generates designs of physical devices that mimic neural network inference computations within physical domains. In other words, the neural network inference computations are mapped directly to one or more physical domains to dramatically lower latency, computational cost, and memory cost in order to enable ubiquitous proliferation of machine learning models to nearly any application domain.

Specifically, instead of using a traditional compute chip to run neural network inference, where inputs are fed in as digital electrical signals, processed by digital logic, and then read out as digital electric signals, embodiments of physical devices described herein receive physical stimuli and output a physical response (i.e., output physical stimuli). In some embodiments, the physical stimuli may correspond to mechanical vibrations due to acoustic pressure waves, electromagnetic waves, quantum fluctuations, and the like. The relationship between the inputs and the outputs of the physical device are governed by the underlying physics of the physical domain. Thus, by understanding the physics of the physical domain, the structure of the physical device may be tailored (e.g., material composition, shape, and the like) to achieve a desired input/output relationship that replicates the inference calculations of a trained neural network with the physical domain. For example, an optical device (i.e., physical device operating in an electromagnetic domain) may receive electromagnetic radiation (e.g., physical stimuli) at an input region. The physical stimuli interacts with the optical device (e.g., the electromagnetic radiation experiences at least one of a perturbation, retransmission, attenuation, refraction, reflection, diffraction, amplification, or the like) and subsequently outputs electromagnetic radiation at an output region in response. The output electromagnetic radiation may have a phase, spatial profile, amplitude, or otherwise that is different from input electromagnetic radiation based on the desired input/output relationship, which is dictated by the structure of the physical device and underlying physics of the physical domain.

Described herein are embodiments of a physics simulator that may be utilized to optimize structures of physical devices, based on first-principles simulations, for performing calculations (e.g., inference calculations of neural networks) in physical domains. More concretely a physics simulator is utilized to model the underlying physics governing operation of the physical device to optimize the structure to replicate an input/output relationship of training data (e.g., from a trained machine learning model, or otherwise) Thus, rather than designing devices based on a pre-determined structure and modifying a limited number of parameters, embodiments described herein utilize an inverse design approach in which the structure of the physical device is changed based on the underlying physics governing the physical domain in which the device operates. In particular, the physics simulator allows for a first-principles based design and optimization of devices based on their optical, electrical, magnetic, acoustic, quantum, and/or fluidic response (e.g., field response) to an excitation source (e.g., physical stimuli). The physics simulator solves the partial-differential equation systems associated with these optical, electrical, mechanical, fluidic, quantum dynamic, and the like systems within a simulated environment to perform operational and adjoint simulations of a physical device. The operational simulation simulates the field response of the simulated environment, including the physical device, to physical stimuli (e.g., excitation source) to determine a performance metric of the physical device (e.g., a simulated output at an output region). A loss metric or value is computed (e.g., a difference between the simulated output and a target output) from a loss function and then the adjoint simulation backpropagates the loss value through the simulated environment to determine the influence of structural parameters (e.g., shape, composition, and the like) of the physical device on the loss value (e.g., structural gradient). The structural gradient may then be used in conjunction with an optimization scheme (e.g., gradient descent) to determine how to change the structural parameters to reduce the loss value. This process may be repeated until the loss value is within some threshold range, which indicates the physical device replicates the input/output relationship of the training data (e.g. from a trained neural network).

It is appreciated that the techniques described in the embodiments of the physics simulator disclosed herein are performed within a computational domain for simulating a physical device residing in a simulated (e.g., virtual) environment to generate a design (e.g., based on structural parameters) for a physical device operating in a physical domain (e.g., electromagnetic, acoustic, and the like). More specifically, the term "physical" device is utilized to emphasize to the reader of the disclosure that the techniques described herein may be used for simulating performance of a physical device within a simulated environment (e.g., within a computational domain) to generate, update, configure, or otherwise optimize designs of a physical device that may ultimately be fabricated for application or use within one or more physical domains. The techniques described herein leverage an "inverse design" approach for determining a relationship between the design (e.g., structural parameters) of the physical device and performance of the physical device (e.g., performance metric) via simulation of the underlying physics that are expected to govern how the physical device operates or may otherwise perform within the physical domain.

FIG. 1A is a functional block diagram illustrating a system 100 for revising or optimizing structural parameters of a physical device, in accordance with an embodiment of the present disclosure. In the following embodiments, the system 100 will be described in context of a physical device operating in an electromagnetic domain (e.g., an optical device). However, it is appreciated that the physical device is not limited to operating in a particular, or even a single, physical domain (e.g., as described in the embodiment of the physical device operating in the electromagnetic domain), but that in some embodiments the physical device may operate in any one of, or a combination of, physical domains including, but not limited to, physical domains such as electromagnetic, acoustic, quantum, capacitive, vibrational, or otherwise. More specifically, system 100 provides first-principles based design and optimization devices based on the optical, electrical, magnetic, acoustic, quantum, and/or fluidic response (e.g., field response) to a physical stimuli (e.g., excitation source). In other words, it is appreciated that system 100 is not limited to modeling operation of optical devices in an electromagnetic domain, and that other devices have a field response in different physical domains to a physical stimuli may also be modeled and subsequently have structural parameters optimized.

As illustrated, system 100 includes controller 105, display 107, input device(s) 109, communication device(s) 111, network 113, remote resources 115, bus 121, and bus 123. Controller 105 includes processor(s) 131, memory 133, storage 135, and physical device simulator 139. Storage 135 includes machine learning model database 136 and training data 137. Physical device simulator 139 includes operational simulation engine 141, adjoint simulation engine 143, calculation logic 145, decomposition logic 147, machine learning logic 149, and optimization engine 151. It is appreciated that in some embodiments, controller 105 may be a distributed system.

Controller 105 is coupled to display 107 (e.g., a light emitting diode display, a liquid crystal display, and the like)

coupled to bus 121 through bus 123 for displaying information to a user utilizing system 100 to optimize structural parameters of the physical device. Input device 109 is coupled to bus 121 through bus 123 for communicating information and command selections to processor 131. Input device 109 may include a mouse, trackball, keyboard, stylus, or other computer peripheral, to facilitate an interaction between the user and controller 105. In response, controller 105 may provide verification of the interaction through display 107.

Another device, which may optionally be coupled to controller 105, is a communication device 111 for accessing remote resources 115 of a distributed system via network 113. Communication device 111 may include any of a number of networking peripheral devices such as those used for coupling to an Ethernet, Internet, wide area network, and the like. Communication device 111 may further include a mechanism that provides connectivity between controller 105 and the outside world. Note that any or all of the components of system 100 illustrated in FIG. 1 and associated hardware may be used in various embodiments of the present disclosure. The remote resources 115 may be part of a distributed system and include any number of processors, memory, and other resources for revising or optimizing the structural parameters of the physical.

Controller 105 orchestrates operation of system 100 for revising and/or optimizing structural parameters of the physical device. Processor 131 (e.g., one or more central processing units, graphics processing units, and/or tensor processing units, etc.), memory 133 (e.g., volatile memory such as DRAM and SRAM, non-volatile memory such as ROM, flash memory, and the like), storage 135 (e.g., magnetic memory such as computer disk drives), and the physical device simulator 139 are coupled to each other through bus 123. Storage 135 includes a machine learning (ML) model database 136, which may include various trained neural networks to perform complex tasks (e.g., classification, identification, translation, and the like). Training data 137 includes a plurality of training datasets, each including paired input and output values such that the training data defines an input/output relationship, which in some embodiments is determined from one or more trained neural networks included in ML model database 136. Controller 105 includes software (e.g., instructions included in memory 133 coupled to processor 131) and/or hardware logic (e.g., application specific integrated circuits, field-programmable gate arrays, and the like) that when executed by controller 105 causes controller 105 or system 100 to perform operations. The operations may be based on instructions stored within any one of, or a combination of, memory 133, storage 135, physics simulator 139, and remote resources 115 accessed through network 113.

In the illustrated embodiment, the modules 141-151 of the physics simulator 139 are utilized to optimize structural parameters of the physical device (e.g., an optical device operating within an electromagnetic domain. More specifically, the optical device has structural parameters optimized to substantially replicate an input/output relationship described by training data within a physical domain. The training data may be obtained from a trained neural network such that the replicated input/output relationship is substantially similar to inference calculations performed by the neural network. In some embodiments, system 100 may optimize structural parameters of the physical device via, inter alia, simulations (e.g., operational and adjoint simulations) that utilize a finite-difference time-domain (FDTD) method to model the field response (e.g., electric and magnetic fields when the physical device operates within the electromagnetic domain). The operational simulation engine 141 provides instructions for performing a simulation of the physical device operating in response to physical stimuli (e.g., an excitation source such as an electromagnetic wave with a specified spatial profile, phase, and the like) within a simulated environment. In particular, the operational simulation determines a field response of the simulated environment (e.g., electric/magnetic field vector values in one or more orthogonal directions for each of a plurality of voxels). The simulated environment includes a plurality of voxels, a portion of which describe the physical device (e.g., based off an initial description or input design of the physical device that describes the structural parameters of the physical device within the simulated environment via the plurality of voxels). The structural parameters may correspond, for example, to the specific design, material compositions, dimensions, and the like of the physical device. The field response of the simulated environment is determined for a plurality of time steps during the operational simulation (e.g., from an initial time step to a final time step that corresponds to when the field response reaches a substantially steady state, reduces to negligible values, or the operational simulation otherwise concludes) to determine a field gradient (e.g., how changes in the structural parameters influence/change the field response). Additionally, the operational simulation may determine a performance metric of the physical device (e.g., an amplitude or phase of electromagnetic radiation at an output region). Adjoint simulation engine 143 is utilized to perform an adjoint simulation which is a time backwards simulation in which a loss value is backpropagated through the simulated environment. In other words, the loss value is treated as an excitation source or physical stimuli and a loss response of the simulated environment to the loss value is determined for calculating a loss gradient (e.g., how changes in the field response influence the loss value). Calculation logic 145 computes a loss value or metric of the physical device based, at least in part, on the performance metric of the physical device. In one embodiment, the loss metric is associated with a difference between the performance metric (e.g., simulated output) and a target output value (e.g., based on the paired input/output values of the training data). In one embodiment, calculation logic 145 is also utilized to determine a structural gradient (e.g., how changes in the structural parameters influence or change the loss metric) based, at least in part, on the field gradient and loss gradient. Decomposition logic 147 facilitates the performance of a variety of tasks, such as extracting decomposition components from the field response to reduce a dimensionality of the field response. In other words, decomposition logic 147 includes instructions for reducing the computational burden of the simulation due to the large state sizes (e.g., caused by the number of voxels and/or time steps). ML logic 149 is utilized to generate training data (e.g., via trained models within ML model database 136) as well as various other tasks regarding configuration, operation, training, and inference of neural networks. Optimization logic 151 is utilized to update the structural parameters of the physical device to reduce the loss value and generate a revised description of the physical device.

Figure 2A:
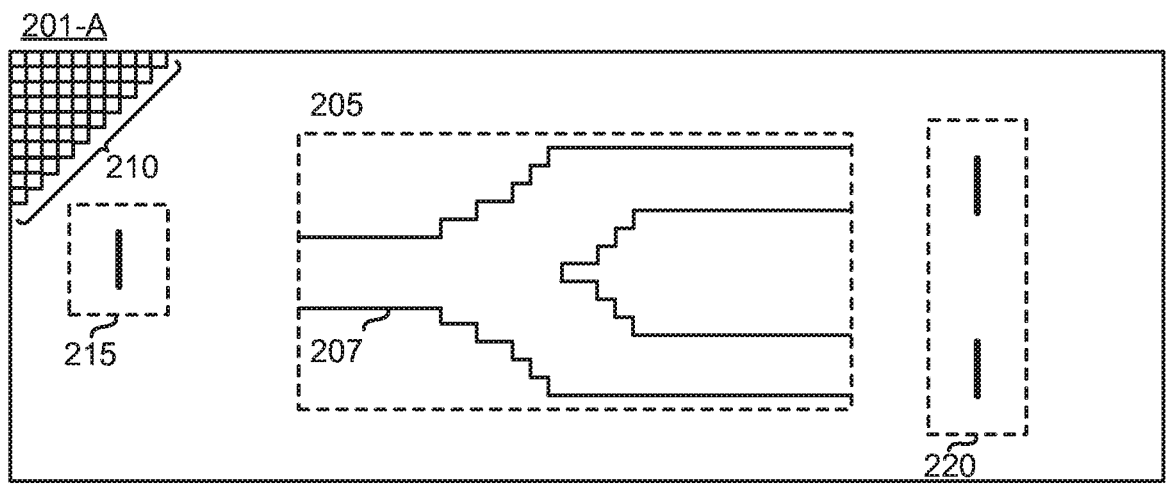
FIG. 2A illustrates a demonstrative simulated environment describing a physical device, in accordance with an embodiment of the present disclosure.
Figure 2B:
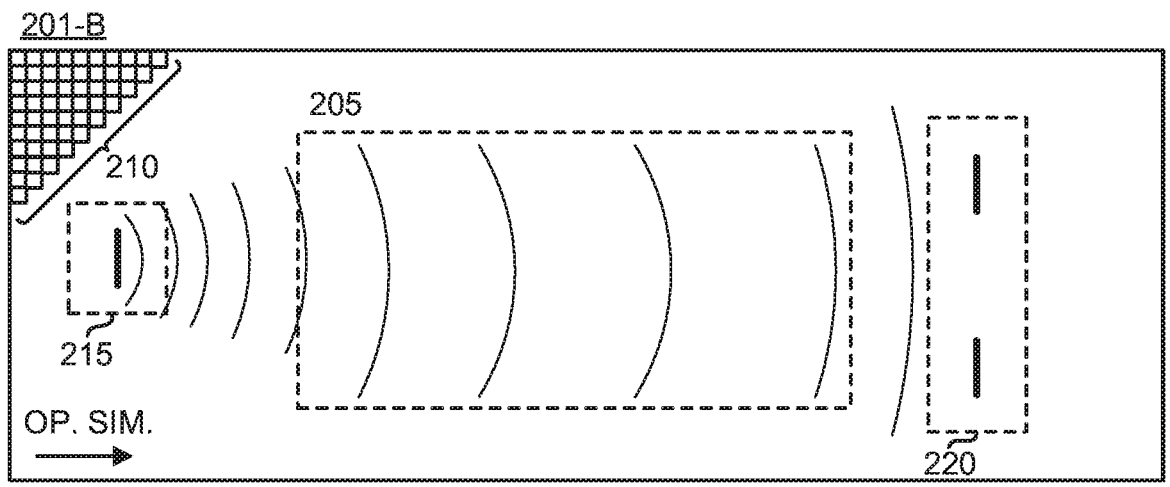
FIG. 2B illustrates an example operational simulation describing a physical device, in accordance with an embodiment of the present disclosure.
Figure 2C:
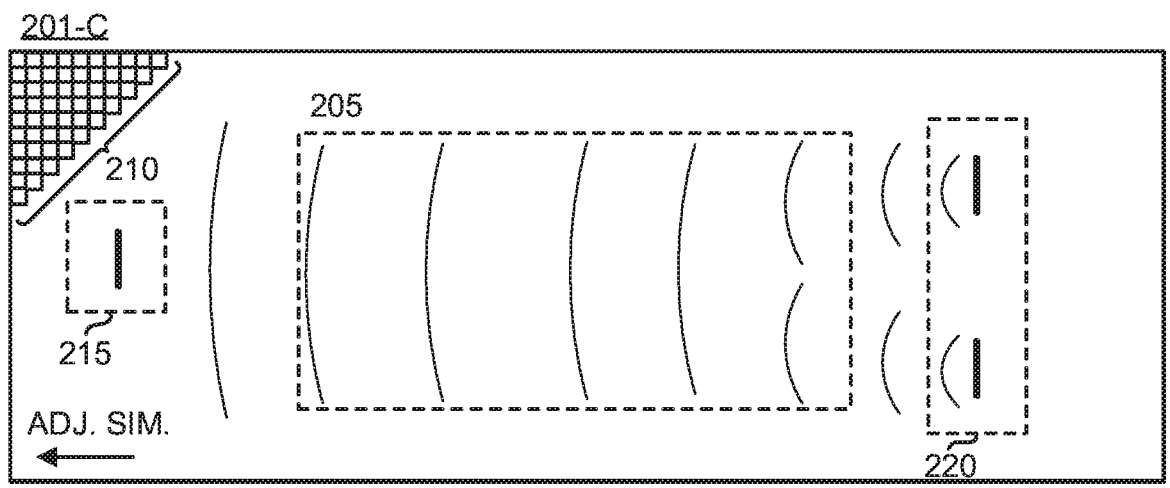
FIG. 2C illustrates an example adjoint simulation within the simulated environment by backpropagating a loss value, in accordance with an embodiment of the present disclosure.

FIGS. 2A-2C respectively illustrate an initial set up of a simulated environment 201-A describing a physical device, performing an operational simulation of the physical device operating in response to physical stimuli within the simulated environment 201-B, and performing an adjoint simulation of the physical device within the simulated environment 201-C. The initial set up of the simulated environment 201, operational simulation of the physical device, and adjoint simulation of the physical device may be implemented with system 100 illustrated in FIG. 1. As illustrated in FIGS. 2A-2C, simulated environment 201 is represented in two-dimensions. However, it is appreciated that higher (e.g., 3-dimensional space) and lower (e.g., 1-dimensional space) dimensionality may also be used to describe simulated environment 201 and the physical device. In some embodiments, optimization of structural parameters of the physical device illustrated in FIGS. 2A-2C may be achieved via, inter alia, simulations (e.g. operational and adjoint simulations) that utilize a finite-difference time-domain (FDTD) method to model the field response (e.g., electric and magnetic fields) to a physical stimuli.

FIG. 2A illustrates a demonstrative simulated environment 201-A describing an optical device (i.e., a physical device), in accordance with an embodiment of the present disclosure. More specifically, in response to receiving an initial description of a physical device defined by one or more structural parameters (e.g., an input design), a system (e.g., system 100 of FIG. 1) configures a simulated environment 201 to be representative of the physical device. As illustrated, the simulated environment 201 (and subsequently the physical device) is described by a plurality of voxels 210, which represent individual elements (i.e., discretized) of the two-dimensional (or other dimensionality) space. Each of the voxels 210 is illustrated as two-dimensional squares. However, it is appreciated that in other embodiments the voxels may be represented with different dimensionality or shape, which may be dependent on the underlying dimensionality of simulated environment 201 and/or the physical device. In one embodiment, simulated environment 201 is described within three-dimensional space to optimize a physical device having a three-dimensional structure. In the same embodiment, the plurality of voxels 210 may be represented as cubes or other shapes in three-dimensional space. Thus, it is appreciated that the specific shape and dimensionality of the plurality of voxels 210 may be adjusted dependent on simulated environment 201 and the physical device being simulated. It is further noted that only a portion of the plurality of voxels 210 are illustrated to avoid obscuring other aspects of simulated environment 201.

Each of the plurality of voxels 210 may be associated with a structural value, a field value, and a source value, which collectively and respectively describe the structural parameters, field response, and physical stimuli. More specifically, the structural values of the simulated environment 201 describe the structural parameters of the physical device. In one embodiment, the initial design of the physical device may be random such that there is essentially no initial design of the physical device. In one embodiment, this may be achieved via a randomized structural value for each of the physical voxels. The structural value represents a physical property or parameter that interacts with the physical stimuli or is otherwise related to the physical domain in which the physical device operates. In one embodiment, the structural values may correspond to relative permittivity, permeability, and/or refractive index that collectively describe structural (i.e., material) boundaries of the physical device. For example, interface 207 is representative of where relative permittivity changes within the simulated environment 201 and may define a boundary of the physical device where a first material meets or otherwise interfaces with a second material. The field values of the plurality of voxels describe the field (or loss) response that is calculated (e.g., via Maxwell's equations) in response to a physical stimuli (e.g., excitation source) described by source value(s). The field response, for example, may correspond to a collection of vector fields describing the electric and/or magnetic fields (e.g., in one or more orthogonal directions) at a particular time step for each of the plurality of voxels 210. Maxwell's equations and the FDTD operations may take into account the structural parameters and excitation source for determining the field response.

In the illustrated embodiment, the physical device corresponds to an optical device having a design region 205, in which structural parameters of the physical device may be updated. The simulated environment 201 may include an input region 215 (e.g., input port) of the physical device corresponding to a location of the physical device to receive an input corresponding to physical stimuli (e.g., a Gaussian pulse, a wave, a waveguide mode response, and the like). The physical stimuli may interact with the physical device based on the structural parameters (e.g., an electromagnetic wave corresponding to physical stimuli may be perturbed, retransmitted, attenuated, refracted, reflected, diffracted, scattered, absorbed, amplified, or otherwise as the wave propagates through the physical device). In other words, physical stimuli cause the field response of the physical device to change, which is dependent on the underlying physics governing the physical domain and the structural parameters of the physical device. The physical stimuli originate at input region 215 and are positioned to propagate (or otherwise influence the field values of the plurality of voxels) through the simulated environment 201 (e.g., through the design region 205 and towards output region 220). In some embodiments, output region 220 corresponds to one or more output ports of the optical device. In the illustrated embodiment, the input region 215 and output region 220 are positioned outside of the design region 205. In other words, in the illustrated embodiment, only a portion of the structural parameters of the physical device is optimizable. However, in other embodiments, the entirety of the physical device may be placed within the design region 205 such that the structural parameters may represent any portion or the entirety of the design of the physical device. The electric and magnetic fields within the simulated environment 201 (and subsequently the physical device) may change (e.g., represented by field values of the individual voxels that collectively correspond to the field response of the simulated environment 201) in response to the physical stimuli. The output region 220 of the optical device may be used for determining a performance metric of the physical device in response to the physical stimuli (e.g., power, waveguide mode, etc.). The initial description of the physical device, including initial structural parameters, physical stimuli, performance parameters or metrics, and other parameters describing the physical device, are received by the system (e.g., system 100 of FIG. 1) and used to configure the simulated environment 201 for performing a first-principles based simulation of the physical device. These specific initial values and parameters may be defined directly by a user (e.g., of system 100 in FIG. 1), indirectly (e.g., via controller 105 culling pre-determined values stored in memory 133, storage 135, or remote resources 115), or a combination thereof.

FIG. 2B illustrates an operational simulation of the physical device in response to a physical stimuli within simulated environment 201-B, in accordance with an embodiment of the present disclosure. In the illustrated embodiment, the physical device is an optical device operating at one or more frequencies of interest and having one or more particular waveguide modes (e.g., transverse electric mode, transverse magnetic mode, or transverse electric and magnetic mode). The physical stimuli originate at an input region 215 having specified spatial, phase, and/or temporal profiles (e.g., based on an input value of a particular training dataset included in training data). The operational simulation occurs over a plurality of time steps, including the illustrated time step. When performing the operational simulation, changes to the field response (e.g., the field value) for each of the plurality of voxels 210 are incrementally updated in response to the physical stimuli over the plurality of time steps. The changes in the field response at a particular time step are based, at least in part, on the structural parameters, the physical stimuli, and the field response of the simulated environment at the immediately prior time step included in the plurality of time steps. Similarly, in some embodiments the source value of the plurality of voxels is updated (e.g., based on the spatial profile and/or temporal profile describing the physical stimuli). It is appreciated that the operational simulation is incremental and that the field values (and source values) of the simulated environment 201 are updated incrementally at each time step as time moves forward for each of the plurality of time steps during the operational simulation. It is further noted that in some embodiments, the update is an iterative process and that the update of each field and source value is based, at least in part, on the previous update of each field and source value.

Once the operational simulation reaches a steady state (e.g., changes to the field values in response to the physical stimuli substantially stabilize, reduce to negligible values) or otherwise concludes, one or more performance metrics may be determined. In one embodiment, the performance metric corresponds to the output mode of the optical device within output region 220. In the same or other embodiments, the performance metric represents power (at one or more frequencies of interest) in the target mode shape at the specific locations of the output ports within output region 220. A loss value or metric of the input design (e.g., the initial design and/or any refined design in which the structural parameters have been updated) based, at least in part, on the performance metric may be determined. The loss value, in conjunction with an adjoint simulation, may be utilized to determine a structural gradient (e.g., influence of structural parameters on loss value) for updating or otherwise revising the structural parameters to reduce the loss value (e.g., increase performance metric to better match the input/output relationship described by the training data). Additionally, the operational simulation may be utilized to determine the field gradient (e.g., the influence of the structural parameters on the field response), which is combined in the appropriate way with the loss gradient to determine the structural gradient.

FIG. 2C illustrates an example adjoint simulation within simulated environment 201-C by backpropagating a loss value, in accordance with an embodiment of the present disclosure. More specifically, the adjoint simulation is a time-backwards simulation in which a loss value is treated as physical stimuli that interacts with the physical device and causes a loss response. In other words, an adjoint (or virtual source) based on the loss value is placed at the output region 220 (e.g., output ports) or other location that corresponds to a location used when determining the performance metric. The adjoint source(s) is then treated as physical stimuli or excitation source during the adjoint simulation. A loss response of the simulated environment 201 is computed for each of the plurality of time steps (e.g., backwards in time) in response to the adjoint source. The loss response collectively refers to loss values of the plurality of voxels that are incrementally updated in response to the adjoint source over the plurality of time steps. The change in loss response based on the placeholder metric may correspond to a loss gradient, which is indicative of how changes in the field response of the physical device influence the loss value. The loss gradient and the field gradient may be combined in the appropriate way to determine the structural gradient of the physical device/simulated environment (e.g., how changes in the structural parameters of the physical device within the simulated environment influence the loss metric). Once the structural gradient of a particular cycle (e.g., operational and adjoint simulation) is known, the structural parameters may be updated to reduce the loss metric and generate a revised description of the physical device.

In some embodiments, iterative cycles of performing the operational simulation and adjoint simulation in parallel, updating the loss gradient, determining the structural gradient, and updating the structural parameters to reduce the loss value are performed successively. An optimization scheme such as gradient descent may be utilized to determine specific amounts or degrees of changes to the structural parameters of the physical device to incrementally reduce the loss value. More specifically, after each cycle the structural parameters are updated (e.g., optimized) to reduce the loss value. The operational simulation, adjoint simulation, and updating the structural parameters are iteratively repeated until the loss value substantially converges or is otherwise below or within a threshold value or range such that the physical device substantially replicates the input/output relationship of the training data.

Figure 3A:
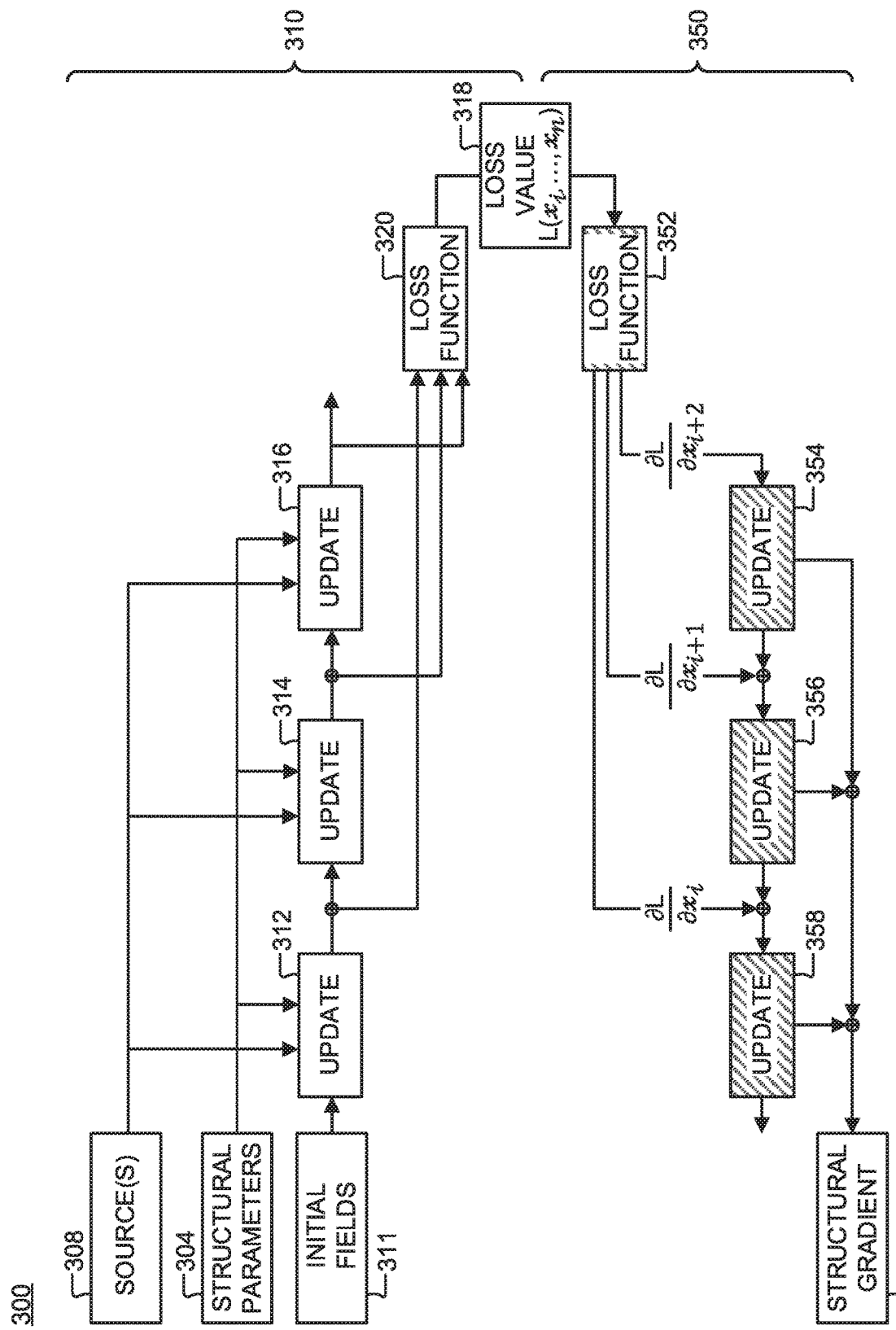
FIG. 3A is a flow chart illustrating example time steps for operational and adjoint simulations, in accordance with an embodiment of the present disclosure.

FIG. 3A is a flow chart 300 illustrating example time steps for the operational simulation 310 and adjoint simulation 350, in accordance with an embodiment of the present disclosure. Flow chart 300 is one possible implementation that a system (e.g., system 100 of FIG. 1) may use to perform the operational simulation 310 and adjoint simulation 350 of the simulated environment (e.g., simulated environment 201 of FIGS. 2A-2C) describing a physical device (e.g., an optical device operating in an electromagnetic domain or other device). In the illustrated embodiment, the operational simulation utilizes a finite-difference time-domain (FDTD) method to model the field response (both electric and magnetic) or loss response at each of a plurality of voxels (e.g., plurality of voxels 210 illustrated in FIGS. 2A-2C) for a plurality of time steps in response to physical stimuli corresponding to an excitation source and/or adjoint source.

As illustrated in FIG. 3A, the flow chart 300 includes update operations for a portion of operational simulation 310 and adjoint simulation 350. Operational simulation 310 occurs over a plurality of time-steps (e.g., from an initial time step to a final time step over a pre-determined or conditional number of time steps having a specified time step size) and models changes (e.g., from the initial field values 311) in electric and magnetic fields of a plurality of voxels describing the simulated environment and/or physical device that collectively correspond to the field response. More specifically, update operations (e.g., 312, 314, and 316) are iterative and based on the field response, structural parameters 304, and one or more physical stimuli sources 308. Each update operation is succeeded by another update operation, which are representative of successive steps forward in time within the plurality of time steps. For example, update operation 314 updates the field values 313 (see, e.g., FIG. 3B) based on the field response determined from the previous update operation 312, sources 308, and the structural parameters 304. Similarly, update operation 316 updates the field values 315 (see, e.g., FIG. 3B) based on the field response determined from update operation 314. In other words, at each time step of the operational simulation the field values (and thus field response) are updated based on the previous field response and structural parameters of the physical device. Once the final time step of the operational simulation 310 is performed, the loss value 318 may be determined (e.g., based on a pre-determined loss function 320). The loss gradients determined from block 352 may be treated as adjoint or virtual sources (e.g., physical stimuli or excitation source originating at an output region) which are backpropagated in reverse (from the final time step incrementally through the plurality of time steps until reaching the initial time step) to determine structural gradient 368.

In the illustrated embodiment, the FDTD solve (e.g., operational simulation 310) and backward solve (e.g., adjoint simulation 350) problem are described pictorially, from a high-level, using only "update" and "loss" operations as well as their corresponding gradient operations. The simulation is set up initially in which the structural parameters, physical stimuli (i.e., excitation source), and initial field states of the simulated environment (and physical device) are provided (e.g., via an initial description and/or input design). As discussed previously, the field values are updated in response to the excitation source based on the structural parameters. More specifically, the update operation is given by $\phi$, where $x_{i+1}=\phi(x_i, \beta_i, z)$ for $i=1, \ldots, n$. Here, n corresponds to the total number of time steps (e.g., the plurality of time steps) for the operational simulation, where $x_i$ corresponds to the field response (the field value associated with the electric and magnetic fields of each of the plurality of voxels) of the simulated environment at time step i, $\beta_i$ corresponds to the excitation source(s) (the source value associated with the electric and magnetic fields for each of the plurality of voxels) of the simulated environment at time step i, and z corresponds to the structural parameters describing the topology and/or material properties of the physical device (e.g., relative permittivity, index of refraction, etc. in the case of an electromagnetic device).

It is noted that using the FDTD method, the update operation may specifically be stated as:

$$\phi(x_i, \beta_i, z) = A(z)x_i + B(z)\beta_i. \quad (1)$$

That is to say the FDTD update is linear with respect to the field and source terms. Concretely, $A(z) \in \mathbb{R}^{N \times N}$ and $B(z) \in \mathbb{R}^{N \times N}$ are linear operators which depend on the structure parameters, z, and act on the fields, $x_i$, and the sources, $\beta_i$, respectively. Here, it is assumed that $x_i, \beta_i \in \mathbb{R}^N$ where N is the number of FDTD field components in the operational simulation. Additionally, the loss operation (e.g., loss function) may be given by $L=f(x_i, \ldots, x_n)$, which takes as input the computed fields and produces a single, real-valued scalar (e.g., the loss value) that can be reduced and/or minimized.

In terms of revising or otherwise optimizing the structural parameters of the physical device, the relevant quantity to produce is $$\frac{dL}{dz},$$

which is used to describe the influence of changes in the structural parameters on the loss value and is denoted as the structural gradient 368 illustrated in FIG. 3A.

Figure 3B:
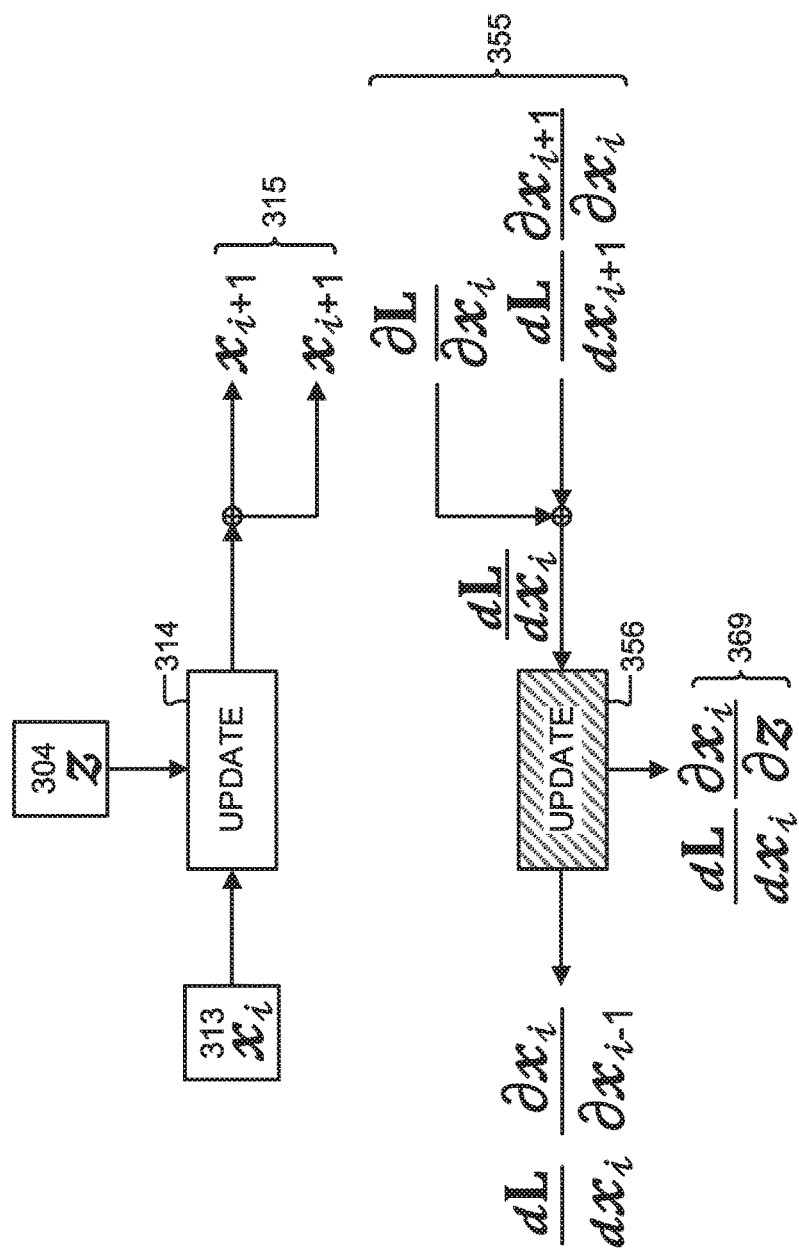
FIG. 3B is a chart illustrating a relationship between gradients determined from an operational simulation and an adjoint simulation, in accordance with an embodiment of the present disclosure.

FIG. 3B is a chart 380 illustrating the relationship between the update operation for the operational simulation and the adjoint simulation (e.g., backpropagation), in accordance with an embodiment of the present disclosure. More specifically, FIG. 3B summarizes the operational and adjoint simulation relationships that are involved in computing the structural gradient, $$\frac{dL}{dz},$$

which include $$\frac{\partial L}{\partial x_i}, \frac{\partial x_{i+1}}{\partial x_i}, \frac{dL}{dx_i}, \text{ and } \frac{\partial x_i}{\partial z}.$$

The update operation 314 of the operational simulation updates the field values 313, $x_i$, of the plurality of voxels at the ith time step to the next time step (i.e., i+1 time step), which correspond to the field values 315, $x_{i+1}$. The gradients 355 are utilized to determine $$\frac{dL}{dx_i}$$

for the backpropagation (e.g., update operation 356 backwards in time), which combined with the gradients 369 are used, at least in part, to calculate the structural gradient, $$\frac{dL}{dz} \cdot \frac{\partial L}{\partial x_i}$$

is the contribution of each field to the loss value, L. It is noted that this is the partial derivative, and therefore does not take into account the causal relationship of $x_i \to x_{i+1}$. Thus, $$\frac{\partial x_{i+1}}{\partial x_i}$$

is utilized which encompasses the $x_i \to x_{i+1}$ relationship. The loss gradient $$\frac{dL}{dx_i}$$

may also be used to compute the structural gradient, $$\frac{dL}{dz},$$

and corresponds to the total derivative of the field with respect to loss value, L. The loss gradient, $$\frac{dL}{dx_i},$$

at a particular time step, i, is equal to the summation of $$\frac{\partial L}{\partial x_i} + \frac{dL}{dx_{i+1}} \frac{\partial x_{i+1}}{\partial x_i}.$$

Finally, $$\frac{\partial x_i}{\partial z},$$

which corresponds to the field gradient, is used which is the contribution to $$\frac{dL}{dz}$$

from each time/update step.

In particular, the memory footprint to directly compute $$\frac{\partial L}{\partial x_i} \text{ and } \frac{dL}{dz}$$

is so large that it is difficult to store more than a handful of state Tensors. The state Tensor corresponds to storing the values of all of the FDTD cells (e.g., the plurality of voxels) for a single simulation time step. It is appreciated that the term "tensor" may refer to tensors in a mathematical sense or as described by the TensorFlow framework developed by Alphabet, Inc. In some embodiments the term "tensor" refers to a mathematical tensor which corresponds to a multidimensional array that follows specific transformation laws. However, in most embodiments, the term "tensor" refers to TensorFlow tensors, in which a tensor is described as a generalization of vectors and matrices to potentially higher dimensions (e.g., n-dimensional arrays of base data types), and is not necessarily limited to specific transformation laws. For example, for the general loss function $f$, it may be necessary to store the fields, $x_i$, for all time steps, i. This is because, for most choices of f, the gradient will be a function of the arguments of f. This difficulty is compounded by the fact that the values of $$\frac{\partial L}{\partial x_i}$$

for larger values of i are needed before the values for smaller i due to the incremental updates of the field response and/or through backpropagation of the loss value, which may prevent the use of schemes that attempt to store only the values $$\frac{\partial L}{\partial x_i},$$

at an immediate time step.

An additional difficulty in performing the is further illustrated when computing the structural gradient, $$\frac{dL}{dz},$$

which is given by:

$$\frac{dL}{dz} = \sum_i \frac{dL}{dx_i} \frac{\partial x_i}{\partial z}. \qquad (2)$$

For completeness, the full form of the first term in the sum, $$\frac{dL}{dz},$$

is expressed as:

$$\frac{dL}{dx_i} = \frac{\partial L}{\partial x_i} + \frac{dL}{dx_{i+1}} \frac{\partial x_{i+1}}{\partial x_i}. \qquad (3)$$

Based on the definition of φ as described by equation (1), it is noted that $$\frac{\partial x_{i+1}}{\partial x_i} = A(z),$$

which can be substituted in equation (3) to arrive at an adjoint update for backpropagation (e.g., the update operations such as update operation 356), which can be expressed as:

$$\frac{dL}{dx_i} = \frac{\partial L}{\partial x_i} + \frac{dL}{dx_{i+1}} A(z), \qquad (4)$$

or $$\nabla_{x_i} L = A(z)^T \nabla_{x_{i+1}} L + \frac{\partial L^T}{\partial x_i}. \qquad (5)$$

The adjoint update is the backpropagation of the loss gradient (e.g., from the loss value) from later to earlier time steps and may be referred to as a backwards solve for $$\frac{dL}{dx_i}.$$

More specifically, the loss gradient may initially be based upon the backpropagation of a loss value determined from the operational simulation. The second term in the sum of the structural gradient, $$\frac{dL}{dz},$$

corresponds to the field gradient and is denoted as:

$$\frac{\partial x_i}{\partial z} = \frac{d\phi(x_{i-1}, b_{i-1}, z)}{dz} = \frac{dA(z)}{dz} x_{i-1} + \frac{dB(z)}{dz} b_{i-1}, \quad (6)$$

for the particular form of $\phi$ described by equation (1). Thus, each term of the sum associated $$\frac{dL}{dz}$$

depends on both $$\frac{dL}{dx_{i_0}}$$

for $i \geq i_0$ and $x_{i_0}$ for $i < i_0$. Since the dependency chains of these two terms are in opposite directions, it is concluded that computing $$\frac{dL}{dz}$$

in this way requires the storage of $x_i$ values for all of i. In some embodiments, the need to store all field values may be mitigated by a reduced representation of the fields (e.g., via decomposition logic illustrated in FIG. 1).

Figure 4:
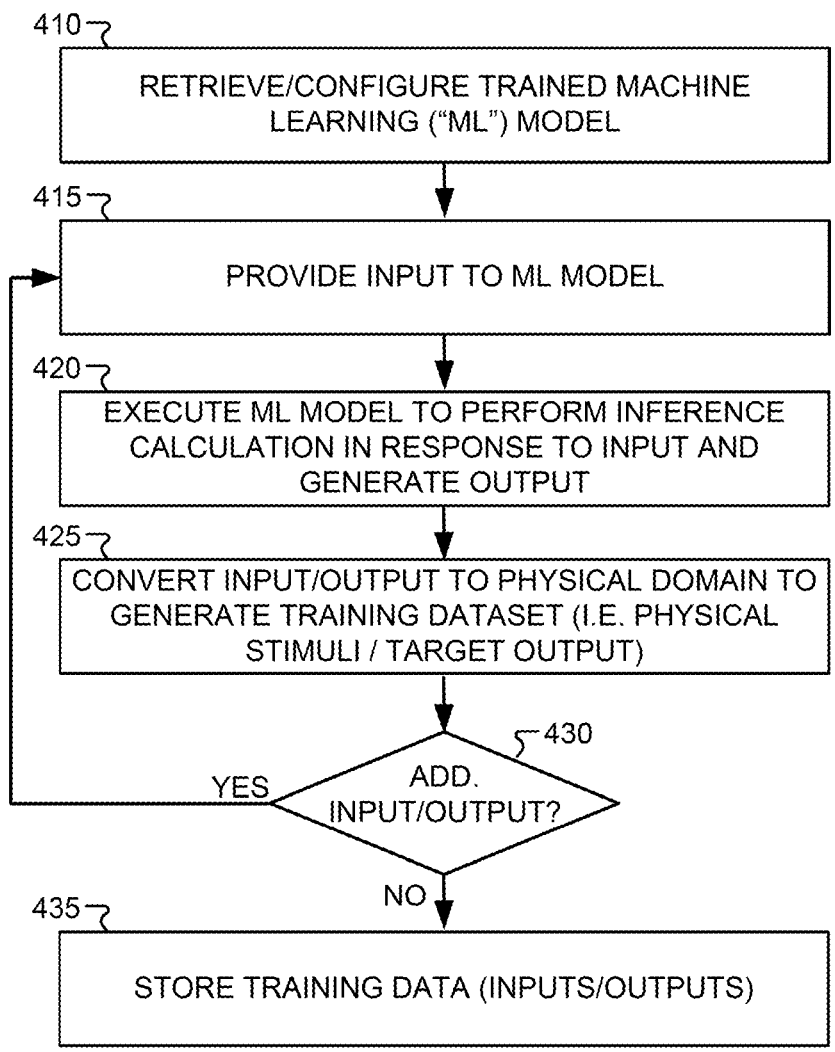
FIG. 4 illustrates a process for generating training data having an input/output relationship based on inference calculations of a trained machine learning model, in accordance with an embodiment of the present disclosure.

FIG. 4 illustrates a process 400 for generating training data having an input/output relationship based on inference calculations of a trained machine learning model, in accordance with an embodiment of the present disclosure. The order in which some or all of the process blocks appear in process 400 should not be deemed limiting. Rather, one of ordinary skill in the art having the benefit of the present disclosure will understand that some of the process blocks may be executed in a variety of orders not illustrated, or even in parallel.

Block 410 illustrates retrieving and/or configuring a trained machine learning ("ML") model (e.g., from ML model database 136 illustrated in FIG. 1). The trained ML model may be a deep neural network that can perform certain complex tasks such as machine vision (e.g., object recognition, character recognition, image classification, and the like), machine translation (e.g., translate audio from one language to another, translate audio to text, and the like), among other things.

Block 415 shows providing an input to the ML model (e.g., an image), which then proceeds to block 420 which illustrates execution of the ML model. The ML model performs inference calculations (e.g., tensor multiplication, tensor inversion, convolution computations, and the like) based on the input and generates an output in response to accomplish the trained task (e.g., object classification).

Block 425 illustrates converting the input and output to a physical domain to generate a training dataset (e.g., physical stimuli and target output, respectively). In some embodiments, the ML model may generate data that is not within the physical domain of the physical device. For example, if the physical device is an optical device, the input and output may be converted to be representative of an electromagnetic domain. In other words, the input would be converted to physical stimuli within the physical domain while the output is converted to an output response within the physical domain. Additionally, the input and output may be limited depending on the structure of the physical device and the type of task being performed. For example, in the case of classifying numbers, the target output would need to have enough variability to enable characterization of numbers zero through nine. The variability may be limited based on the structural parameters or design of the physical device (e.g., of the input or output regions). In other embodiments, it may not be necessary to convert the input and/or output. For example, conversion of audio information may not be necessary if the physical device is an acoustic device operating within an acoustic or vibrational domain.

Block 425 proceeds to block 430 which illustrates a check to determine if additional inputs or outputs are desired (i.e., more training data needed). For example, if a minimum amount of target training data (e.g., target amount of training datasets) is set then block 430 will proceed to block 415 to provide another input value to the ML model. If a minimum or threshold amount of training data has been achieved (or there are no additional inputs available) block 430 proceeded to block 435. The threshold amount of training data may be requisite to capture the input/output relationship defined by the machine learning model.

Block 435 shows storing the training data (e.g., within local storage, memory, distributed resources or otherwise illustrated in FIG. 1). The training data includes a plurality of datasets, each associated with a respective input and corresponding output value generated by the trained ML model in response. More specifically, the input and output values converted to the physical domain of the physical device may be stored and correspond to the plurality of training datasets.

Figure 5:
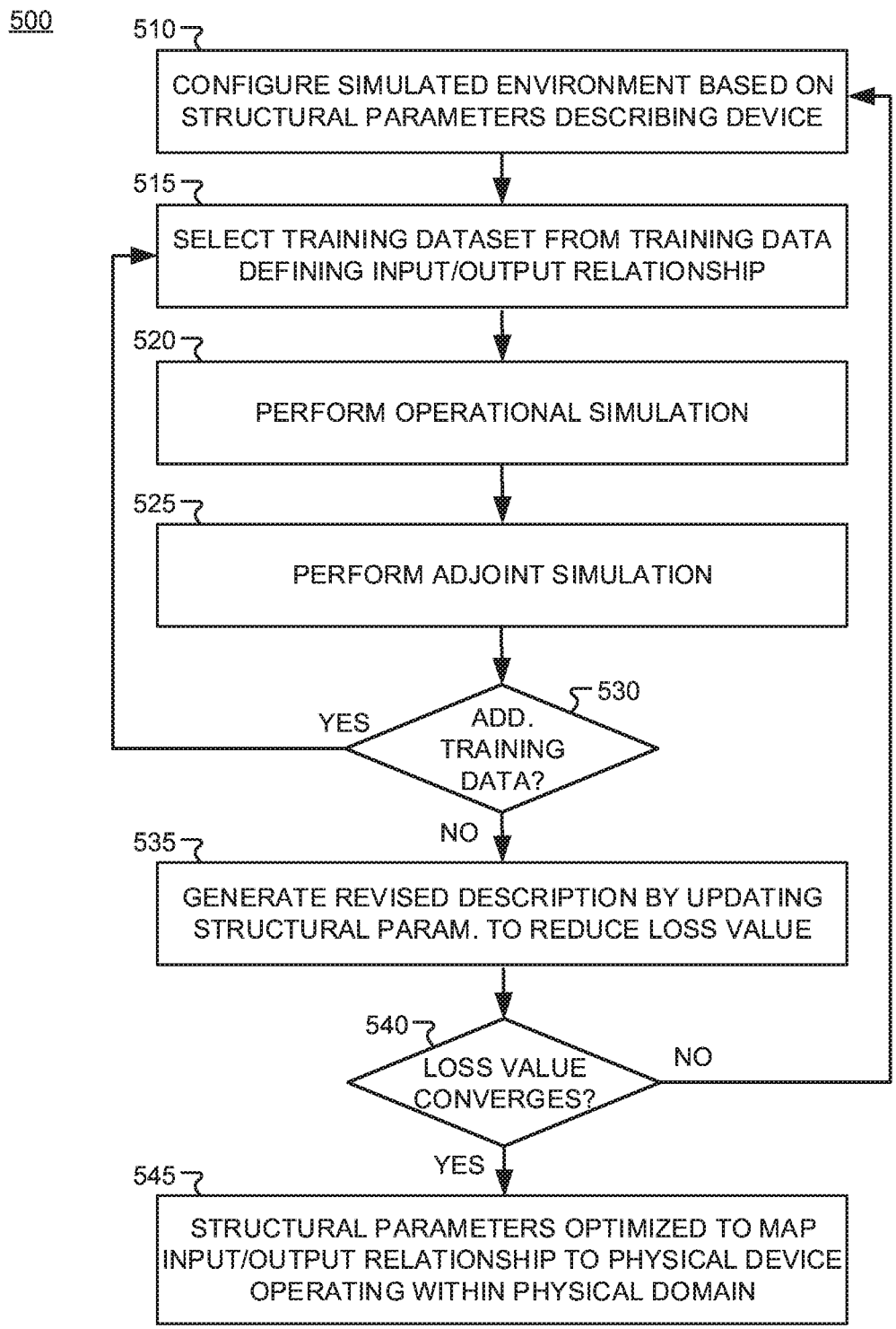
FIG. 5 illustrates a process for revising structural parameters of a physical device to replicate an input/output relationship within a physical domain, in accordance with an embodiment of the present disclosure.

FIG. 5 illustrates a process 500 for revising or optimizing structural parameters of a physical device to replicate an input/output relationship within a physical domain, in accordance with an embodiment of the present disclosure. The order in which some or all of the process blocks appear in process 400 should not be deemed limiting. Rather, one of ordinary skill in the art having the benefit of the present disclosure will understand that some of the process blocks may be executed in a variety of orders not illustrated, or even in parallel.

Block 510 illustrates receiving (or otherwise obtaining) an initial description of a physical device (e.g., an optical device operating in the electromagnetic domain). The initial description may describe structural parameters of the physical device within a simulated environment. The simulated environment may include a plurality of voxels that collectively describe the structural parameters of the physical device. Each of the plurality of voxels is associated with a structural value to describe the structural parameters, a field value to describe the field response (e.g., the electric and magnetic fields in one or more orthogonal directions) to physical stimuli, and a source value to describe the physical stimuli. Once receiving or obtaining the initial description, the simulated environment is configured (e.g., the number of voxels, shape/arrangement of voxels, and specific values for the structural value, field value, and/or source value of the voxels are set based on the initial description). In some embodiments the initial description may be a first description of the physical device in which values for the structural parameters may be random values or null values outside of input and output regions such that there is no bias for the initial (e.g., first) design. It is appreciated that the initial description or input design may be a relative term. Thus, in some embodiments an initial description may be a first description of the physical device described within the context of the simulated environment (e.g., a first input design for performing a first operational simulation). However, in other embodiments, the term initial description may refer to an initial description of a particular cycle (e.g., of performing an operational simulation, operating an adjoint simulation, and updating the structural parameters). In such an embodiment, the initial description or design of that particular cycle may correspond to a revised description or refined design (e.g., generated from a previous cycle). In one embodiment, the simulated environment includes a design region that includes a portion of the plurality of voxels which have structural parameters that may be updated, revised, or otherwise changed to optimize the structural parameters of the physical device. In the same or other embodiments, the structural parameters are associated with geometric boundaries and/or material compositions of the physical device based on the material properties (e.g., relative permittivity, index of refraction, etc.) of the simulated environment.

Block 515 shows selecting one or more training datasets from training data. The training data includes a plurality of training datasets that collectively define the input/output relationship to be replicated (e.g., for performing a complex task based on inference calculations or otherwise within a physical domain). Each of the training datasets includes an input value (e.g., physical stimuli in the physical domain of the physical device) and a target output value (e.g., an output response in the physical domain). The physical domain may include any one of or a combination of an electromagnetic domain, an acoustic domain, a quantum domain, a capacitive domain, a vibrational domain, or otherwise. More specifically, the physical device is structured or otherwise comprises of material elements (e.g., regions of different material compositions) or structures (e.g., interdigitated electrodes on a piezoelectric material to generate surface acoustic waves or otherwise) to generate a physical response or interaction that is output from the physical device. The electromagnetic domain may correspond to any domain in which electromagnetic radiation (e.g., light at one or more pre-determined frequencies) propagates or otherwise interacts with the physical device. The acoustic or vibrational domain may correspond to any domain in which acoustic (or vibrational) waves interact with the physical device to generate an output (e.g., surface acoustic wave devices). Other examples of the vibrational domain may correspond to phonons in solids and the like. The capacitive domain may refer to elements which may be capacitively coupled (e.g., metal lines capacitively coupled to one another) or otherwise.

Block 520 illustrates performing an operational simulation of the physical device within the simulated environment operating in the physical domain in response to the physical stimuli. More specifically, the physical stimuli are treated as an excitation source and a field response is updated incrementally over a plurality of time steps to determine how the physical stimuli and the physical device interact (e.g., how the field response of the physical device changes due to the physical stimuli). The field values of the plurality of voxels are updated in response to the physical stimuli and based, at least in part, on the structural parameters of the physical device. Additionally, each update operation at a particular time step may also be based, at least in part, on a previous (e.g., immediately prior) time step.

Consequently, the operational simulation simulates an interaction between the physical device and the physical stimuli to determine a simulated output of the physical device in response to the physical stimuli. The interaction may correspond to any one of, or combination of a perturbation, retransmission, attenuation, refraction, reflecting, diffraction, absorption, scattering, amplification, or otherwise of the physical stimuli within the physical domain due, at least in part, to the structural parameters of the physical device and underlying physics governing operation of the physical device. Thus, the operational simulation simulates how the field response of the simulated environment changes due to the physical stimuli over a plurality of time steps (e.g., from an initial to final time step with a predetermined step size). Put succinctly, the operational simulation determines a simulated output from the output region based on the field response changed by the physical stimuli originating at the input region. The paired physical stimuli and simulated output is representative of an input/output relationship within the physical domain.

In some embodiments, the simulated output corresponds to a performance metric and is compared to a target output associated with the physical stimuli/input from a particular training dataset included in the training data. The simulated output is compared (e.g., a differenced) to the target output and a loss value for that particular training dataset may be computed or otherwise determined.

Block 525 shows performing an adjoint simulation by backpropagating the loss value through the simulated environment to determine an influence of changes in the structural parameters on the loss value (i.e., structural gradient). More specifically, the adjoint simulation is utilized to determine a loss gradient, which is combined with a field gradient determined from the operational simulation to determine the structural gradient. The loss value is treated as an adjoint or virtual source and is backpropagated incrementally from a final time step to earlier time steps in a backwards simulation to determine how changes in the field response influence the loss value (i.e., loss gradient). Once the loss gradient is known and the field gradient is known based on the field response with respect to time from the operational simulation, the two gradients may be combined in the appropriate way to determine the structural gradient, which indicates how changes in the structure influence the loss value.

Block 530 illustrates determining if there is additional training data. Since the goal of the physical device is to replicate an input/out relationship (e.g., defined by training data derived from a neural network) to perform various tasks it is necessary to include sufficient training data such that the physical device substantially replicates the inference calculations of the neural network. If there are additional training datasets to be utilized for determining the gradients (e.g., loss gradient, field gradient, and structure gradient) block 530 proceeds to block 515, in which the selection of training data, performing operational simulation, computing loss value, performing adjoint simulation are repeated to determine a structural gradient based on the newly selected training dataset. This process continues successively or in parallel. If there are no additional training datasets included in the training data, block 530 proceeds to block 535.

It is appreciated that in some embodiments, the additional training data. and training datasets described respectively by blocks 515 and 530 may correspond to input data that the machine learning model (e.g., as illustrated by block 415 of FIG. 4) would use. In other words, rather than utilizing training datasets that explicitly define the input/output relationship, the input data of the ML model may be used to update the design of the physical device, which would implicitly cause the physical device to replicate the input/output relationship of the neural network.

Block 535 shows generating a revised description of the physical device by updating the structural parameters to reduce the loss value (e.g., based on the structural gradient). In some embodiments, an optimization scheme such as gradient descent is utilized to determine how to explicitly adjust the structural parameters. The specific route for optimization is dependent on the optimization algorithm. For example, a true gradient descent algorithm updates structural parameters after the structural gradient for the entirety of the training data is computed, a stochastic gradient descent updates structural parameters after the structural gradient for an individual one of the training datasets included in the training data is determined, and batch gradient descent updates structural parameters after structural gradients for a batch of two or more training datasets are determined. Based on the optimization algorithm the structural parameters are updated to reduce the loss value and block 535 proceeds to block 540. In some embodiments, the revised description is generated by utilizing an optimization scheme after a cycle of operational and adjoint simulations via a gradient descent algorithm.

Block 540 illustrates determining whether the loss value substantially converges such that the difference between the simulated output and the target output is within a threshold range. In some embodiments, the term "converges" may simply indicate the difference is within the threshold range and/or below some threshold value. Iterative cycles of successively performing the operational simulation, back-propagating the loss value (e.g., adjoint simulation), adjusting or otherwise updating the structural parameters (e.g., optimization) to reduce the loss value are repeatedly performed (e.g., block 540 proceeds to block 510) until the loss metric is reduced to be within the threshold range and block 540 proceeds to block 545.

Block 545 illustrates outputting a revised design or description of the physical device in which the structural parameters map an input/output relationship to a physical device operating within a physical domain. Upon completion of the cycles of selecting training datasets, performing the operational simulation, performing the adjoint simulation, and updating the structural parameters, the loss value is iteratively reduced until the loss value substantially converges within a threshold range. An optimized design of the physical device is subsequently generated upon completion of the cycles. The optimized design of the physical device substantially replicates an input/output relationship described by the training data within the physical domain. In other words, the physical device is capable of performing what is essentially inference calculations (based on the training data obtained from a trained neural network) to perform complex tasks. Put in another way, the structural parameters of the physical device are updated such that the simulated output generated by the interaction between the physical device and the physical stimuli is analogous to a calculation being performed within the physical domain. Such calculation may be substantially equivalent to those being performed by neural networks during inference and may include, but are not limited to, tensor multiplication, tensor inversions, convolution computations, and the like.

Figure 6:
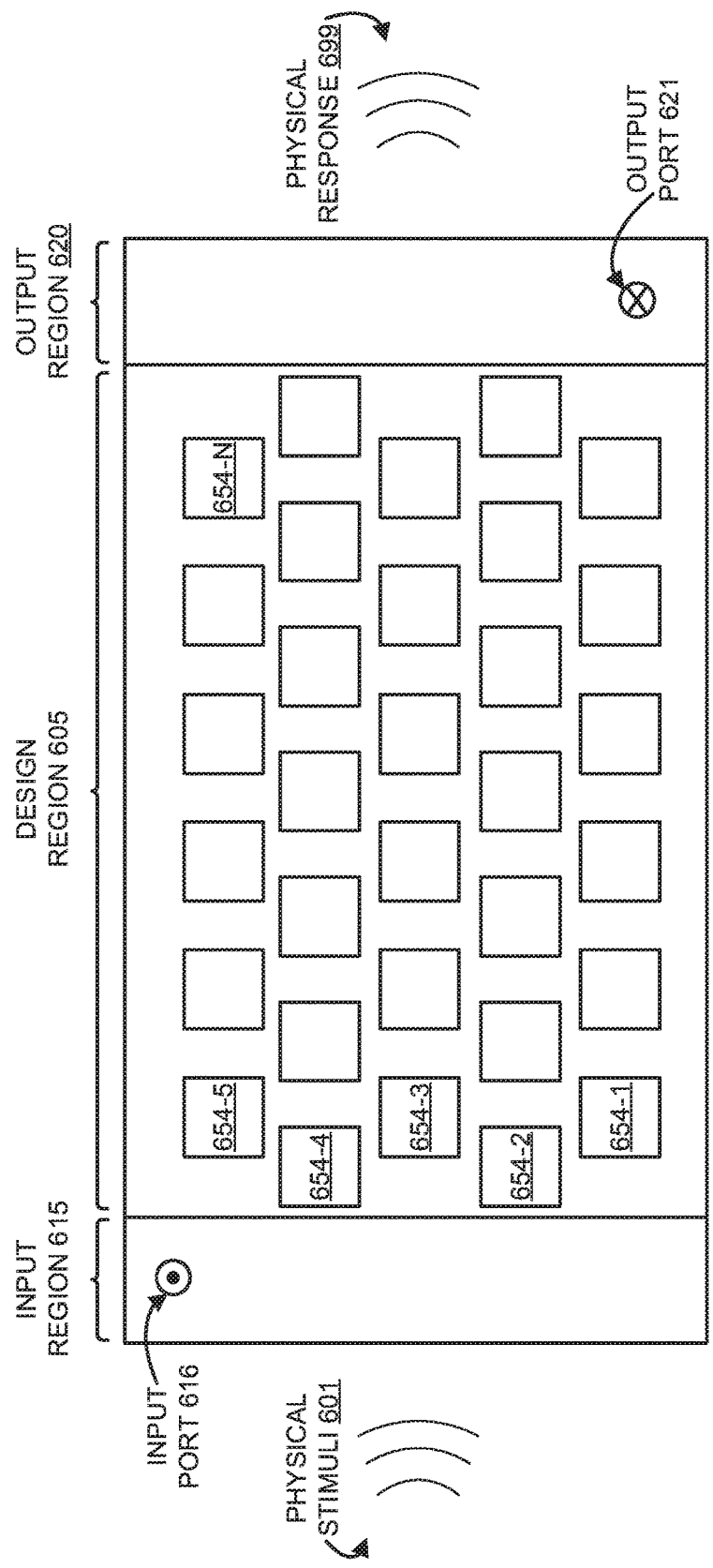
FIG. 6 illustrates a physical device structured to perform inference calculations within a physical domain, in accordance with an embodiment of the present disclosure.

FIG. 6 illustrates an example physical device 600 structured to perform inference calculations within a physical domain, in accordance with an embodiment of the present disclosure. Physical device 600 is one possible implementation of a physical device designed (e.g., as a result of revising or optimizing structural parameters) by an inverse design tool (e.g., system 100 illustrated in FIG. 1). As illustrated in FIG. 6, physical device 600 includes input region 615 and output region 620 disposed proximate to design region 605. Input region 615 is positioned to receive physical stimuli 601 in one or more physical domains. Output region 620 is positioned to output or otherwise provide a physical response 699 in response to the physical device 600 receiving physical stimuli 601. Various material regions 654-1 to 654-N (e.g., regions of differing material composition) are arranged within design region 605 such that a field response (e.g., electric and/or magnetic field vectors at various points within the physical device 650) changes in response to the physical stimuli 601. The changes of the field response correspond to a wave (e.g., electromagnetic, acoustic, and the like) that is manipulated by the material regions 654 to perform inference calculations within the physical domain as the wave propagates through the physical device. The physical response 699 generated at the output region (e.g., at output port 621) is a result of the inference calculations. The inference calculations mimic an input/output relationship defined by training data (e.g., from a trained machine learning model) such that physical device 650 may perform some complex task (e.g., classification). In some embodiments, the inference calculations may correspond to at least one of a tensor multiplication, tensor inversion, convolution computation, kernelling, or the like. Succinctly, physical device 600 replicates an input/output relationship of a machine learning model within the physical domain, wherein the inference calculations correspond to the calculations necessary to arrive at an output (e.g., classified) in response to an input (e.g., unclassified).

In one embodiment, input region 615 includes an input port 616 and output region 620 receives an output port 621. In such an embodiment, physical stimuli 601 may interact with the various material regions 654 resulting in the received physical stimuli 601 being perturbed, retransmitted, attenuated, refracted, reflected, diffracted, amplified, scattered, absorbed, or any combination thereof to perform inference calculations and generate a physical response 699 at output port 621. Material regions 654 may correspond to regions of changing material parameters (e.g., transitioning between silicon oxide and silicon) or material structures (e.g., presence of piezoelectric material, interdigitated transducers, or the like) such that a field response of the physical device 600 may change in response to the physical stimuli 601. These changes in field response may generate or otherwise correspond to a wave (e.g., a wave of electromagnetic radiation) that propagates through physical device 600 and is changed in a manner that corresponds to the inference calculations.

It is appreciated that in some embodiments, the design region 605 may encompass the entirety of the physical device 600 such that an inverse design tool may optimize or otherwise revise structural parameters included, but not limited to the input ports, output ports, material regions 654, among others.

Figure 7:
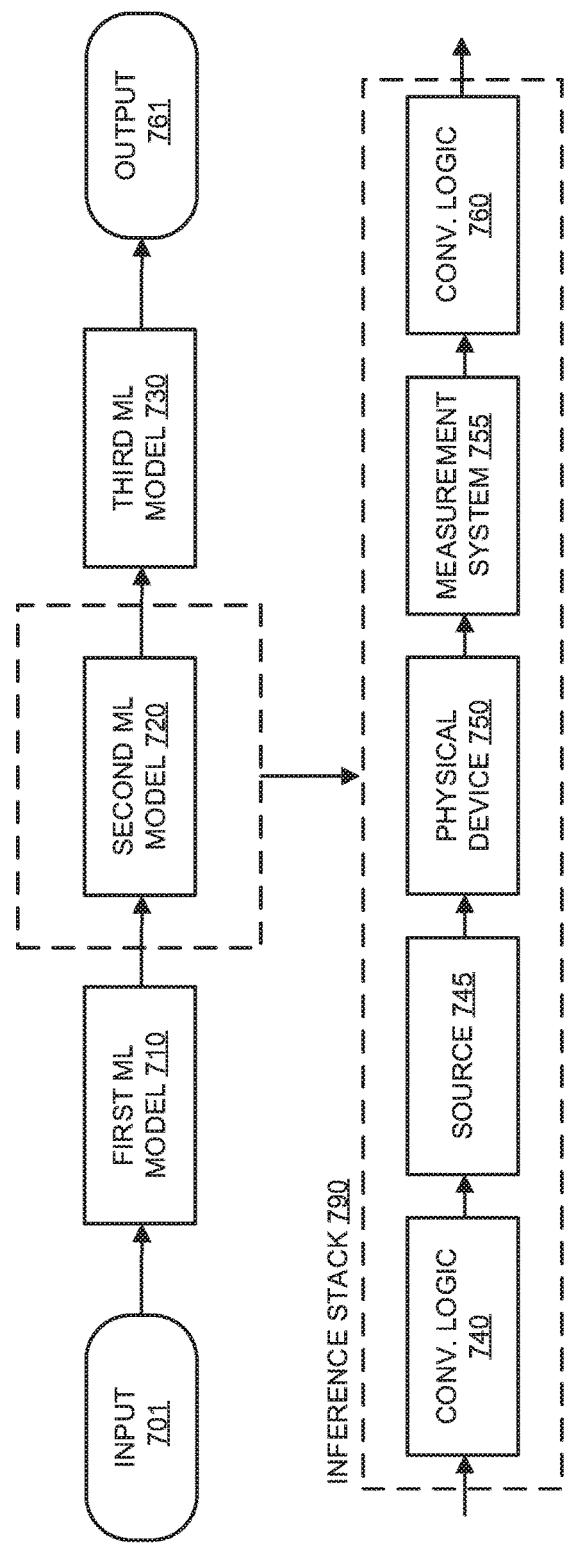
FIG. 7 illustrates an example physical device to provide inference calculations of a machine learning model in a physical domain, in accordance with an embodiment of the present disclosure.

FIG. 7 illustrates an example physical device 750 to provide inference calculations to a cascaded machine learning model 700 in a physical domain, in accordance with an embodiment of the present disclosure. As illustrated, a cascaded machine learning model 700 may receive an input 701, perform various inference computations, and generate an output 761 in response to perform a complex task (e.g., classify an object, image, or otherwise). In the illustrated embodiment, cascaded machine learning model includes first ML model 710, second ML model 720, and third ML model 730, which are arranged to cascade inputs and outputs to one another. For example, each of the first ML model 710, second ML model 720, and third ML model 730 may perform different operations on the received input (e.g., perform convolutions, maxpooling, and the like) to accomplish the trained task. However, certain computations of the architecture may be significantly compute heavy or otherwise costly (e.g., in memory). To mitigate this cost an inference stack 760 which utilizes an inverse designed physical device 650 (e.g., based on a design from system 100 illustrated in FIG. 1) that may be included to replace a portion of the cascaded machine learning model 700. For example, inference stack 790 and/or physical device 750 may correspond to a "drop-in" unit, which may be used to replace specific operational or computational units of an existing neural network (or otherwise model) architecture. In other words, digital logic utilized to perform pre-determined computations may instead be performed in the physical domain via physical device 750. This may correspond to a hybrid device or system in which a portion of the calculations are done within a digital domain (e.g., by digital logic) and another portion of the calculations are performed within the physical domain (e.g., optical, acoustic, and the like).

Interface stack 790 includes conversion logic 740 and 760, source 745, physical device 750, and measurement system 755. Physical device 750 is designed to perform substantially similar computations as second ML model 720, but in a physical domain rather than a digital domain. For example, performing operations such as tensor multiplication, tensor inversion, and/or convolutions may be less costly in the physical domain than the digital domain. Physical device 750 is thus structured to replicate an input/output relationship of second ML model 720 to perform the inference calculations in the physical domain. Conversion logic 740 converts a digital output received from first ML model 710 into instructions, that when used by source 745 (e.g., a laser, a speaker, MEMs device, or otherwise) may generate a physical stimuli within the physical domain of physical device 750. Physical device 750 receives the physical stimuli and generates an output response that is measured by measurement system 755 (e.g., image sensor) which in combination with conversion logic 760 is converted to a digital signal to be sent to third ML model 730. Thus, interface stack 790 provides substantially the same digital inputs and outputs of second ML model 720, but does so by doing the cost prohibitive calculations (e.g., inference calculations) within the physical domain.

Figure 8A:
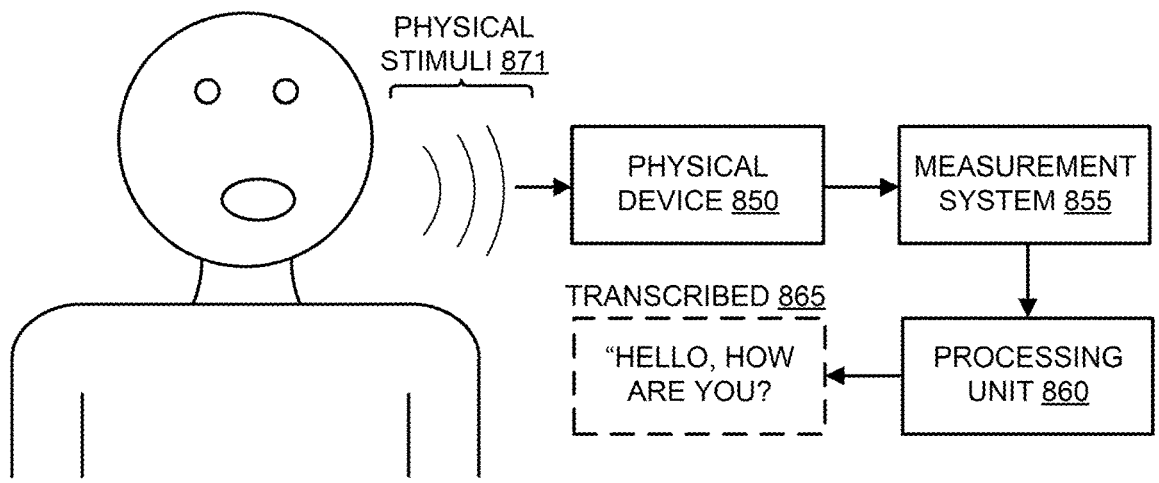
FIGS. 8A and 8B illustrate example physical devices to provide pre-processing inference calculations in a physical domain, in accordance with an embodiment of the present disclosure.
Figure 8B:
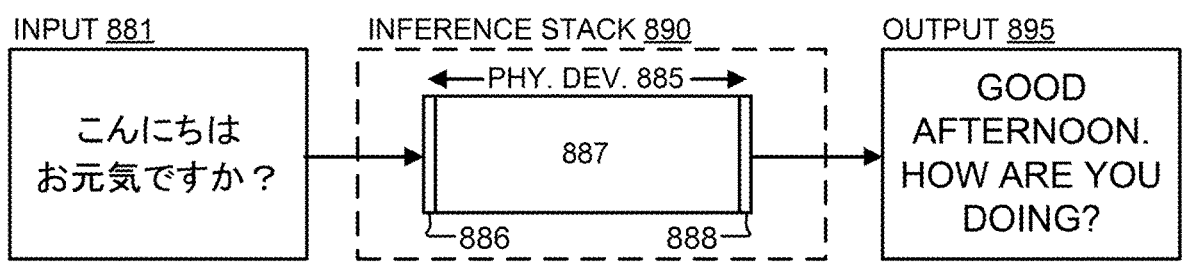

FIGS. 8A and 8B illustrate example physical devices 850 and 885 to provide pre-processing inference calculations in a physical domain, in accordance with an embodiment of the present disclosure. Physical devices 850 and 885 may be based on designs from an inverse design tool (e.g., system 100 illustrated in FIG. 1), in which a specific input/output relationship is mapped by the structure of the device to perform calculations within a physical domain.

FIG. 8A illustrates physical device 850, which preprocesses audio information to functionally transcribe acoustic data in real-time. In the illustrated embodiment, a subject (e.g., a person) transmits a physical stimuli 871 (e.g., speaks), which is received by physical device 850 as an input. Physical device 850 is structured to interact with the physical stimuli (e.g., via a microphone membrane with holes, actuators, surface acoustic wave devices, among other things that are arranged to replicate an input/output relationship of a trained neural network) to produce an output in a physical domain. The physical device interacts with the physical stimuli 871 and produces an output response that in essence performs calculations to classify the audio signal (e.g., provide an indication of what is being said). A measurement system 855 (e.g., interdigitated transducers, A/D convertor, and the like) measures the output response of the physical device 850 and provides a digital input to a processing unit 860 (e.g., CPU) to provide a transcription 865 of what was said by the subject. Advantageously, such inference computations performed within the physical domain may be less computationally expensive and provide greater functionality to low power and low cost devices.

FIG. 8B illustrates physical device 885 coupled to provide translation of images of text from one language to another. In the illustrated embodiment an input 881 of a text image in the Japanese language is provided to inference stack 890, which includes physical device 885, and provides an output 895 that corresponds to a translation into English of the Japanese text. Inference stack 890 may be similar to inference stack 790 illustrated in FIG. 7. Thus, inference stack 890 of FIG. 8B may convert image data to a physical stimulus that is received by an input region 886 in a physical domain. In response, an output region may output a physical response in response to receiving the physical stimulus. The physical response is indicative of an input/output relationship to perform a complex task (e.g., translate text between different languages). Design region 887 of physical device 885 is positioned proximate to the input region and output region (e.g., disposed between the input region 886 and output region 888) and structured to interact with the physical stimulus to perform inference calculations within a physical domain. The physical response output of the physical device 885 is received by conversion logic of the inference stack 890 to convert the output response to a digital domain to provide a translation of the received input 881 as an output 895. It is appreciated that physical devices 850 and 885 are possible implementations of physical devices 750 illustrated in FIG. 7 and physical device 600 illustrated in FIG. 6, which may be designed by an inverse design tool (e.g., system 100 illustrated in FIG. 1). Accordingly, physical devices 850 and 885 may have the same or similar features as described in relationship to the various embodiments of physical devices discussed throughout the present disclosure.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A computer-implemented method for revising structural parameters of a physical device under simulation, the method comprising:
    configuring a simulated environment to be representative of the physical device based, at least in part, on an initial description of the physical device that describes the structural parameters of the physical device, wherein the simulated environment is defined by a plurality of voxels having respective structural values that collectively correspond to the structural parameters of the physical device;
    performing an operational simulation of the physical device within the simulated environment based on training data representative of physical stimuli within a physical domain, and wherein the operational simulation simulates an interaction between the physical device and the physical stimuli based on the respective structural values of the plurality of voxels to determine a simulated output of the physical device in response to the physical stimuli;
    computing a loss value based, at least in part, on the simulated output of the physical device;
    performing an adjoint simulation by backpropagating the loss value through the simulated environment to determine an influence of changes in the structural parameters on the loss value; and
    generating a revised description of the physical device by updating the structural parameters to reduce the loss value.

2. The computer-implemented method of claim 1, wherein the physical domain includes at least one of an electromagnetic domain, an acoustic domain, a quantum domain, a capacitive domain, or a vibrational domain.

3. The computer-implemented method of claim 1, wherein the interaction that is simulated corresponds to at least one of a perturbation, retransmission, attenuation, refraction, reflection, diffraction, or amplification of the physical stimuli within the physical domain.

4. The computer-implemented method of claim 1, wherein the simulated environment includes an input region and an output region of the physical device, and wherein the operational simulation determines the simulated output based on a field response from the output region in response to the input region receiving the physical stimuli.

5. The computer-implemented method of claim 1, wherein the structural parameters are updated such that the simulated output generated by the interaction between the physical device and the physical stimuli is analogous to a calculation being performed within the physical domain.

6. The computer-implemented method of claim 5, wherein the calculation includes at least one of a tensor multiplication, tensor inversion, or convolution computation.

7. The computer-implemented method of claim 1, wherein the training data includes a plurality of training datasets, each one of the training datasets including an input value and target output value, and wherein the input value is representative of at least one of the physical stimuli.

8. The computer-implemented method of claim 7, wherein the loss value is based, at least in part, on a comparison between the simulated output of the physical device and the target output value of a corresponding one of the plurality of training datasets associated with the operational simulation.

9. The computer-implemented method of claim 7, further comprising:
    performing cycles, each cycle including performing the operational simulation, performing the adjoint simulation, and updating the structural parameters to reduce the loss value, and wherein the cycles iteratively reduce the loss value until the loss value converges to within a threshold range.

10. The computer-implemented method of claim 9, further comprising:
    generating an optimized design of the physical device based on the structural parameters that have been updated upon completion of the cycles, and wherein the optimized design of the physical device replicates an input/output relationship described by the training data within the physical domain.

11. The computer-implemented method of claim 10, further comprising:
    generating the training data based on inference calculations of a trained machine learning model that describes the input/output relationship.

12. At least one non-transitory machine-readable storage medium that provides instructions that, when executed by a machine, will cause the machine to perform operations comprising:
    configuring a simulated environment to be representative of the physical device based, at least in part, on an initial description of the physical device that describes the structural parameters of the physical device, wherein the simulated environment is defined by a plurality of voxels having respective structural values that collectively correspond to the structural parameters of the physical device;
    performing an operational simulation of the physical device within the simulated environment based on training data representative of physical stimuli within a physical domain, and wherein the operational simulation simulates an interaction between the physical device and the physical stimuli based on the respective structural values of the plurality of voxels to determine a simulated output of the physical device in response to the physical stimuli;
    computing a loss value based, at least in part, on the simulated output of the physical device;
    performing an adjoint simulation by backpropagating the loss value through the simulated environment to determine an influence of changes in the structural parameters on the loss value; and
    generating a revised description of the physical device by updating the structural parameters to reduce the loss value.

13. The at least one non-transitory machine-readable storage medium of claim 12, wherein the physical domain includes at least one of an electromagnetic domain, an acoustic domain, a quantum domain, a capacitive domain, or a vibrational domain.

14. The at least one non-transitory machine-readable storage medium of claim 12, wherein the interaction that is simulated corresponds to at least one of a perturbation, retransmission, attenuation, refraction; reflection, diffraction, or amplification of the physical stimuli within the physical domain.

15. The at least one non-transitory machine-readable storage medium of claim 12, wherein the simulated environment includes an input region and an output region of the physical device, and wherein the operational simulation determines the simulated output based on a field response from the output region in response to the input region receiving the physical stimuli.

16. The at least one non-transitory machine-readable storage medium of claim 12, wherein the structural parameters are updated such that the simulated output generated by the interaction between the physical device and the physical stimuli is analogous to a calculation being performed within the physical domain.

17. The at least one non-transitory machine-readable storage medium of claim 16, wherein the calculation includes at least one of a tensor multiplication, tensor inversion, or convolution computation.

18. The at least one non-transitory machine-readable storage medium of claim 17, providing additional instructions that, when executed by the machine, will cause the machine to perform further operations, comprising:
performing cycles, each cycle including performing the operational simulation, performing the adjoint simulation, and updating the structural parameters to reduce the loss value, and wherein the cycles iteratively reduce the loss value until the loss value converges to within a threshold range.

19. The at least one non-transitory machine-readable storage medium of claim 18, providing additional instructions that, when executed by the machine, will cause the machine to perform further operations, comprising:
generating an optimized design of the physical device based on the structural parameters that have been updated upon completion of the cycles, and wherein the optimized design of the physical device replicates an input/output relationship described by the training data within the physical domain.

20. The at least one non-transitory machine-readable storage medium of claim 19, providing additional instructions that, when executed by the machine, will cause the machine to perform further operations, comprising:
generating the training data based on inference calculations of a trained machine learning model that describes the input/output relationship.

21. The at least one non-transitory machine-readable storage medium of claim 12, wherein the training data includes a plurality of training datasets, each one of the training datasets including an input value and target output value, and wherein the input value is representative of at least one of the physical stimuli.

22. The at least one non-transitory machine-readable storage medium of claim 21, wherein the loss value is based, at least in part, on a comparison between the simulated output of the physical device and the target output value of a corresponding one of the plurality of training datasets associated with the operational simulation.

23. A physical device to perform inference calculations within a physical domain, the physical device comprising:
an input region to receive a physical stimulus in a physical domain;
an output region to output a physical response in response to receiving the physical stimulus; and
a design region positioned proximate to the input region and the output region, wherein the design region is structured to interact with the physical stimulus to perform the inference calculations within the physical domain wherein material regions of the physical device are arranged within the design region such that a field response of the physical device changes in response to the physical stimulus, and wherein the changes correspond to a wave that is manipulated by the material regions to perform the inference calculations as the wave propagates through the physical device.

24. The physical device of claim 23, wherein the physical response at the output region is a result of the inference calculations.

25. The physical device of claim 23, wherein the inference calculations correspond to at least one of a tensor multiplication, tensor inversion, or convolution computation.

26. The physical device of claim 23, wherein the physical domain includes at least one of an electromagnetic domain, an acoustic domain, a quantum domain, a capacitive domain, or a vibrational domain.

27. The physical device of claim 23, wherein the physical device replicates an input/output relationship of a machine learning model within the physical domain.

* * * * *